US008823307B2

(12) United States Patent
Gajic et al.

(10) Patent No.: US 8,823,307 B2
(45) Date of Patent: Sep. 2, 2014

(54) SYSTEM FOR DETECTING INTERNAL WINDING FAULTS OF A SYNCHRONOUS GENERATOR, COMPUTER PROGRAM PRODUCT AND METHOD

(71) Applicants: Zoran Gajic, Vasteras (SE); Mustafa Ibrahim, Vasteras (SE); Antonis Marinopoulos, Vasteras (SE); Pedro Rodriguez, Vasteras (SE); Jianping Wang, Vasteras (SE); Liwei Wang, Vasteras (SE)

(72) Inventors: Zoran Gajic, Vasteras (SE); Mustafa Ibrahim, Vasteras (SE); Antonis Marinopoulos, Vasteras (SE); Pedro Rodriguez, Vasteras (SE); Jianping Wang, Vasteras (SE); Liwei Wang, Vasteras (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 14/147,017

(22) Filed: Jan. 3, 2014

(65) Prior Publication Data
US 2014/0117912 A1 May 1, 2014

Related U.S. Application Data

(63) Continuation of application No. PCT/EP2011/061188, filed on Jul. 4, 2011.

(51) Int. Cl.
*G01R 31/02* (2006.01)

(52) U.S. Cl.
USPC ........... 318/490; 318/801; 318/807; 318/812; 340/657; 340/658; 702/58; 702/115

(58) Field of Classification Search
USPC ......... 318/808, 804, 807, 720, 802, 798, 700, 318/490, 765.01, 599, 629, 805, 806, 811, 318/717, 705, 609, 611, 375, 376; 702/58, 702/59, 60, 64; 363/34, 50, 52, 54, 39, 40, 363/89, 41, 71, 98, 79, 27, 161, 10, 127; 700/293, 292, 286, 291; 324/545, 522, 324/765.01, 547, 521, 509, 510, 626; 340/660, 691.6, 870.16, 870.25, 988; 361/35, 80, 76, 20, 78, 36, 59, 86; 307/45, 82, 87, 102, 105
See application file for complete search history.

(56) References Cited

U.S. PATENT DOCUMENTS 5,270,640 A 12/1993 Kohler et al.
5,514,978 A 5/1996 Koegl et al.
(Continued)

FOREIGN PATENT DOCUMENTS

CN 101741062 A 6/2010

OTHER PUBLICATIONS

Sang Bin Lee, et al.; "A Robust, On-Line Turn-Fault Detection Technique for Induction Machines Based on Monitoring the Sequence Component Impedance Matrix"; May 2003; pp. 865-872
(Continued)

*Primary Examiner* — Shawki S Ismail
*Assistant Examiner* — Jorge L Carrasquillo
(74) *Attorney, Agent, or Firm* — St. Onge Steward Johnston & Reens LLC

(57) ABSTRACT

A system, method and computer program product for monitoring including detecting internal faults especially inter-turn faults of a synchronous generator and thus protecting the synchronous generator. The synchronous generator includes a winding for each phase of a power network, a terminal for each phase arranged on a terminal side of the synchronous generator, and connected to the respective winding, the terminals on the terminal side are connected to an electrical power network, and the synchronous generator is arranged to input power to the electrical power network by means of the terminals.

20 Claims, 5 Drawing Sheets

(56) References Cited

U.S. PATENT DOCUMENTS

| | | | |
|---|---|---|---|
| 6,141,196 A | 10/2000 | Premerlani et al. | |
| 6,313,752 B1 * | 11/2001 | Corrigan et al. | 340/657 |
| 7,528,611 B2 | 5/2009 | Kasztenny et al. | |
| 7,592,772 B2 | 9/2009 | Nandi et al. | |
| 7,812,615 B2 | 10/2010 | Gajic et al. | |
| 7,873,496 B2 | 1/2011 | Gajic | |
| 2010/0194323 A1 * | 8/2010 | Premerlani et al. | 318/490 |
| 2010/0194324 A1 * | 8/2010 | Kasztenny et al. | 318/490 |
| 2010/0320953 A1 | 12/2010 | Yeh et al. | |

OTHER PUBLICATIONS

Cash, et al.; "Insulation Failure Prediction in AC Machines Using Line-Neutral Voltages"; Nov./Dec. 1998.

International Preliminary Report on Patentability Application No. PCT/EP2011/061188 Completed: Aug. 8, 2013 5 pages.

International Search Report and Written Opinion of the International Searching Authority Application No. PCT/EP2011/061188 Completed: Feb. 13, 2012; Mailing Date: Feb. 24, 2012 10 pages.

* cited by examiner

SYSTEM FOR DETECTING INTERNAL WINDING FAULTS OF A SYNCHRONOUS GENERATOR, COMPUTER PROGRAM PRODUCT AND METHOD

FIELD OF THE INVENTION

The invention relates to systems for fault detection and protection of a synchronous generator. Especially it concerns detecting winding faults of the synchronous generator, for example in a high power synchronous generator for a hydro, thermal or nuclear power plant.

BACKGROUND OF THE INVENTION

An important factor enabling high reliability at electric power plants is to provide generators, such as high power generators in hydro or nuclear power plants, with condition monitoring systems in order to detect faults at an early stage. The invention aims to provide an improved diagnosing, detecting and protection method capable of detecting and identifying winding faults in a synchronous generator, especially inter-turn faults in a synchronous generator. Such internal short-circuit faults of a generator may lead to severe damage if not discovered and attended to. To detect inter-turn faults a few methods have been employed, including transverse differential protection and harmonic signature analysis.

The transverse differential protection is a widely-used method and provides good sensitivity and reliability for the synchronous generator inter-turn fault protection. This method utilizes the unbalanced or differential current between stator winding branches in each phase to indicate the existence of an inter-turn fault. For every winding that is monitored, the current through the winding in every branch of each phase is measured in both ends of the winding. Having dedicated measuring devices such as current transformers (CTs) in each end of each winding requires many measuring devices, thus increasing the overall cost of this type of protection. Sometimes, the synchronous generator stator winding branches are inside the machine due to manufacture preference and are not accessible for CT installation, and therefore limits the use of the method.

U.S. Pat. No. 7,528,611 (D1) describes a method and a system for detecting winding faults in a generator with parallel windings, especially inter-turn faults between the parallel windings. The system includes an arrangement of current transformers 24, 26, 28, 30, 32, and 34 on the terminal side of the generator, one current transformer for each coil branch (FIG. 1 in D1) with two branches in each phase. The current transformers are arranged to sense a difference between the coils of each phase, and output a split-phase current signal for each phase (abstract, column 5, line 60-column 6, line 2). The split-phase current signals are supplied to a microprocessor-based relay (38) adapted to detect inter-turn short circuit faults and output an alarm or a tripping signal (column 6, line 5-14). The system of D1 uses less current transformers than a conventional transverse differential protection, especially the system of D1 does not use current transformers on the neutral side of the generator. The system of D1 requires one current transformer for each coil winding of each phase. In practice it is often difficult to access the winding for installing a current transformer.

The harmonic signature analysis method utilizes harmonic spectrum of the synchronous generators voltages or currents to detect stator inter-turn fault. When stator inter-turn fault occurs, some characteristic harmonic components appear in the harmonic spectrum of the stator and rotor currents as the inter-turn fault signatures. However, the power electronic devices used in the power grid, such as converters or rectifiers, system disturbances and unbalanced operation of the external power grids may also induce harmonics that could influence the signatures and thus reduce the reliability of this method.

U.S. Pat. No. 7,592,772 describes inter-turn fault detection using an analysis of harmonics having a rotor search coil for measuring the rotor field winding current. The search coil is arranged at the field winding of the rotor. In industrial installations it is often difficult or impossible to install such a search coil. Also, when the frequency varies, the harmonic component cannot be accurately measured. The invention provides an alternative to such measurements and analysis of the rotor currents.

The article "A Robust On-Line Turn Fault Detection Technique for Induction Machines Based on Monitoring the Sequence Component Impedance Matrix" describes an inter-turn fault detection of induction motors based on a symmetrical sequence component impedance matrix. The changing of the off-diagonal elements of the symmetrical sequence impedances indicates the occurrence of inter-turn faults. In order to obtain data and parameters for the detection algorithm the method includes learning stages, which includes several intentional unbalanced operations. See the article: "S. Lee, R. Tallam, T. Habetler, *IEEE Transaction on Power Electronics* "A robust on-line turn fault detection technique for induction machines based on monitoring the sequence component impedance matrix," vol. 18, no. 3, 2003".

Such unbalanced learning stages are impractical for application on high power synchronous generators during their normal operation.

SUMMARY OF THE INVENTION

An aim of the invention is to provide a method for detecting winding faults, especially inter-turn winding faults, which is easy to use, still being reliable. The present invention provides a method and system for detecting winding faults of a synchronous generator comprising a stator with windings and terminals for the machine currents, and a rotor, which is arranged to rotate within the stator. By detecting and identifying winding faults, especially inter-turn faults so that tripping commands can be issued to disconnect the generator in case of the inter-turn faults, as a consequence, protection against a malfunctioning generator and reparations of the generator are facilitated.

For these purposes, the present invention provides a method for detecting an internal fault of a synchronous generator, where the synchronous generator comprises windings for each phase of a power network, at least one terminal for each phase arranged on a terminal side of the synchronous generator, and connected to the respective windings, the terminals on the terminal side are connectable to an electrical power network, and the synchronous generator is arranged to input power to the electrical power network by means of the terminals. The synchronous generator is preferably a generator wherein each winding comprises at least two winding branches. The method comprises measuring the voltage ($V_a$, $V_b$, $V_c$) of each phase at the at least one each terminal and the current ($I_a$, $I_b$, $I_c$) of each phase at the at least one each terminal, determining whether the synchronous generator suffers from an inter-turn fault in any of its phases. The determining includes transforming the measured phase currents ($I_a$, $I_b$, $I_c$) and the measured phase voltages ($V_a$, $V_b$, $V_c$) into symmetric sequence currents ($I_1$, $I_2$, $I_0$) and symmetric sequence voltages ($V_1$, $V_2$, $V_0$), respectively; monitoring at least one of the following four variables: (i) a negative sequence residual voltage ($\Delta V_2$); (ii) a zero sequence residual voltage ($\Delta V_0$); (iii) a negative sequence coupling impedance ($Z_{2C}$); and (iv) a zero sequence coupling impedance ($Z_{0C}$); wherein each of the variables is calculated from symmetric sequence components ($I_1$, $I_2$, $I_0$, $V_2$, $V_0$) and at least one generator specific impedance ($Z_{00}$, $Z_{22}$), and discovering whether the synchronous generator suffers from a winding fault, or not, from the calculated at least one residual voltage ($\Delta V_0$, $\Delta V_2$) or coupling impedance ($Z_{0C}$, $Z_{2C}$).

In a preferred embodiment the method includes protecting the synchronous generator upon determining that the synchronous generator suffers from an internal fault, which protecting includes at least one of the steps of: displaying a visual indication of the inter-turn fault for an operator; alerting an operator by means of an audible alarm; trip the synchronous generator circuit breakers to disconnect the generator from the power network, trip the excitation circuit AC side field breakers to remove the rotor field voltage, and trip the generator turbines.

In an embodiment the negative sequence residual voltage ($\Delta V_2$) is monitored by means of the negative sequence voltage ($V_2$), the negative sequence current ($I_2$) and the negative sequence self impedance ($Z_{22}$); the zero sequence residual voltage ($\Delta V_0$) is monitored by means of the zero sequence voltage ($V_0$), the zero sequence current ($I_0$) and the zero sequence self impedance ($Z_{00}$); the negative sequence (to positive) coupling impedance ($Z_{2C}$) is monitored by means of the negative sequence voltage ($V_2$), the negative sequence current ($I_2$), the positive sequence current ($I_1$) and the negative sequence self impedance ($Z_{22}$); and/or the zero sequence (to positive sequence) coupling impedance ($Z_{0C}$) is monitored by means of the zero sequence voltage ($V_0$), the zero sequence current ($I_0$), the positive sequence current ($I_1$) and the zero sequence self impedance ($Z_{0C}$).

In an embodiment the method comprises determining the direction angle of the negative sequence current in relation to the angle of the positive sequence current of at least one phase (a, b, c), and deducing that the internal fault is an inter-turn fault upon determining this angle to be approximately 180 degrees, 60 degrees or minus 60 degrees.

Preferably, the method comprises identifying which phase (a, b, c) suffers from an inter-turn fault from the angle, wherein 180 degrees indicates the same phase (A) as measured, minus 60 degrees indicates the subsequent phase (B), and 60 degrees indicates the previous phase (C).

The method is performed during operation of the synchronous generator.

Usually, synchronous generator three phases are constructed symmetrically. The invention is mainly intended for symmetrical synchronous generators. Under healthy conditions, the synchronous generator three-phase stator currents are well balanced, and symmetrical. Therefore, the symmetrical component analysis of the stator voltages and currents gives positive sequence components without or having very small amounts of negative and zero sequence components.

Under an internal winding fault condition, such as an inter-turn fault, the stator terminal three-phase currents are not symmetrical due to an internal unbalance in the synchronous generator. Therefore, negative sequence voltages and currents appear and can be detected in the synchronous generator terminals.

The invention also provides a system for detecting and protecting against internal winding faults of a synchronous generator. The detecting system is provided for detecting internal winding faults of a synchronous generator, while the synchronous generator comprises windings for each phase of a power network, a terminal for each phase arranged on a terminal side of the synchronous generator, and connected to the respective winding, the terminals on the terminal side is connected to an electrical power network, and the synchronous generator is arranged to input power to the electrical power network by means of the terminals. Preferably the detecting system is arranged for detecting winding faults in a generator having windings where each winding comprises at least two winding branches. The detecting system comprises an input measurement circuit, including ND converters, arranged for measuring the terminal phase voltages and terminal phase currents analogue values, being adapted for the secondary side of current and voltage measuring devices, obtaining measurements from the voltage measuring devices and the current measuring devices arranged at the terminals of the synchronous generator. The detecting and protection system further comprises a mathematical transformation provider for transforming phase voltages into symmetrical sequence voltage components and phase currents into symmetrical sequence current components, and a winding fault determiner adapted to detect internal winding faults in the synchronous generator from the negative sequence components, and preferably also the zero sequence components, of the voltages and currents.

In an embodiment, the winding fault determiner is adapted to detect an internal winding fault based on at least one of the following four variables; (i) a negative sequence residual voltage ($\Delta V_2$); (ii) a zero sequence residual voltage ($\Delta V_0$); (iii) a negative sequence coupling impedance ($Z_{2C}$); and (iv) a zero sequence coupling impedance ($Z_{0C}$). Preferably each of the variables is calculated from symmetric sequence components ($I_1$, $I_2$, $I_0$, $V_2$, $V_0$) and at least one generator specific impedance ($Z_{00}$, $Z_{22}$).

In an embodiment the negative sequence residual voltage ($\Delta V_2$) is calculated from the negative sequence voltage ($V_2$), the negative sequence current ($I_2$) and the negative sequence self impedance ($Z_{22}$); the zero sequence residual voltage ($\Delta V_0$) is calculated from the zero sequence voltage ($V_0$), the zero sequence current ($I_0$) and the zero sequence self impedance ($Z_{0C}$); negative sequence coupling impedance ($Z_{2C}$) is calculated from the negative sequence voltage ($V_2$), the negative sequence current ($I_2$), the positive sequence current ($I_1$) and the negative sequence self impedance ($Z_{22}$), and the zero sequence coupling impedance ($Z_{00}$) is calculated from the zero sequence voltage ($V_0$), the zero sequence current ($I_0$), the positive sequence current ($I_1$) and the zero sequence self impedance ($Z_{00}$).

In an embodiment the system further includes an inter-turn fault determiner adapted to discover an inter-turn fault by analysing the direction angle of at least one negative sequence current, in relation to the corresponding positive sequence current of the same phase.

In an embodiment, the inter-turn fault determiner includes a phase identifier adapted to identify which phase that suffers from an inter-turn fault by analysing the direction of the negative sequence current, especially wherein 180 degrees indicates the same phase as measured, 60 degrees indicates the subsequent phase, and minus 60 degrees indicates the previous phase.

In an embodiment, the system comprises symmetry fault detector adapted to monitor the amounts of the negative sequence voltages and the negative sequence currents, and to detect symmetry faults, including using at least one of the following criteria:

when the negative sequence currents exceeds a first small threshold (2-5%) at the same time as the negative sequence voltages is below a second small threshold (0.5-2%) determining that the synchronous generator suffers from an internal fault;

when the negative sequence currents exceeds a third small threshold (2-5%) at the same time as the negative sequence voltages is above a fourth small threshold (0.5-5%) diagnosing a symmetry fault, either that the synchronous generator suffers from an internal fault or that the network grid suffers from an imbalance.

The present invention uses stator terminal side currents and voltages to determine symmetrical sequence components such as negative sequence currents and voltage, positive sequence currents and voltage, negative sequence coupling impedance and zero sequence coupling impedance in order to detect changes in these components. The invention is preferably adapted also to check the rotor current variations to provide the detection of inter-turn faults. The given method use terminal side measurements in generator stators to discover internal winding faults and is adapted to rely on measurements provided for the power generation by means of current and voltage measuring devices used for monitoring, detecting the generated power, without needing to install dedicated fault discovering current measuring devices.

Preferably the monitoring, including detecting, of the stator terminals is used together with rotor exciter terminal current signals, and therefore it is quite practical to be implemented in generator protection systems and suitable for industry applications.

The invention also provides a computer program product for determining an internal fault, especially inter-turn faults, of a synchronous generator. The computer program product is provided for protecting a synchronous generator that comprises a winding for each phase of a power network, a terminal for each phase being arranged on a terminal side of the synchronous generator, and connected to the respective winding, the terminals on the terminal side are connectable to an electrical power network and the synchronous generator is arranged to input power to the electrical power network by means of the terminals. The computer program product is, when run on a computer that receives current ($I_a$, $I_b$, $I_c$) and voltage ($V_a$, $V_b$, $V_c$) measurements from measuring devices arranged at the phase terminals of the synchronous generator, adapted to cause the computer to perform the following steps (i) transform (302, 502) the measured phase currents ($I_a$, $I_b$, $I_c$) and the measured phase voltages ($V_a$, $V_b$, $V_c$) into symmetric sequence currents ($I_1$, $I_2$, $I_0$) and symmetric sequence voltages ($V_1$, $V_2$, $V_0$), respectively; (ii) monitor (305, 505) at least one of the following variables: a negative sequence residual voltage ($\Delta V_2$); a zero sequence residual voltage ($\Delta V_0$); a negative sequence coupling impedance ($Z_{2C}$); a zero sequence coupling impedance ($Z_{0C}$); wherein each of the variables is calculated from symmetric sequence components ($I_1$, $I_2$, $I_0$, $V_2$, $V_0$) and at least one generator specific impedance ($Z_{00}$, $Z_{22}$), and (iii) determine (306, 504, 506) whether the synchronous generator suffers from a winding fault, or not, from the calculated at least one residual voltage ($\Delta V_0$, $\Delta V_2$) or coupling impedance ($Z_{0C}$, $Z_{2C}$).

In an embodiment the negative sequence residual voltage ($\Delta V_2$) is monitored by means of the negative sequence voltage ($V_2$), the negative sequence current ($I_2$) and the negative sequence self impedance ($Z_{22}$); the zero sequence residual voltage ($\Delta V_0$) is monitored by means of the zero sequence voltage ($V_0$), the zero sequence current ($I_0$) and the zero sequence self impedance ($Z_{00}$); the negative sequence coupling impedance ($Z_{2C}$) is monitored by means of the negative sequence voltage ($V_2$), the negative sequence current ($I_2$), the positive sequence current ($I_1$) and the negative sequence self impedance ($Z_{22}$); and/or the zero sequence coupling impedance ($Z_{0C}$) is monitored by means of the zero sequence voltage ($V_0$), the zero sequence current ($I_0$), the positive sequence current ($I_1$) and the zero sequence self impedance ($Z_{00}$).

In an embodiment the steps comprises determining the direction angle (alpha) of the negative sequence current in relation to the angle of the positive sequence current of at least one phase (a, b, c), and deducing that the internal fault is an inter-turn fault upon determining this angle (alpha) to be approximately 180 degrees, 60 degrees or minus 60 degrees.

Preferably identifying which phase (a, b, c) suffers from an inter-turn fault from the angle (alpha), wherein 180 degrees indicates the same phase (a) as measured, minus 60 degrees indicates the subsequent phase (b), and 60 degrees indicates the previous phase (c).

In an embodiment the computer program product is also adapted to cause the computer to perform at least one of the steps of: (a) displaying a visual indication of an inter-turn fault for an operator, (b) providing an audible alarm signal for an operator, (c) providing a tripping signal for disconnecting the synchronous generator from the power network, upon determining that the synchronous generator suffers from an internal fault.

Useful features provided by the present invention are the following:
(1) the negative sequence coupling impedance (or residual voltage) which tells the internal unbalance severity of the machine caused by inter-turn fault;
(2) the negative sequence current direction with respect to the positive sequence current which reveal not only the inter-turn fault but also the faulty phase; and
(3) the rotor current AC component calculated from the AC exciter side which also provide a measure of the unbalanced degree of the machine in case of inter-turn faults.

BRIEF DESCRIPTION OF THE DRAWINGS

FIG. 2 illustrates winding details of the synchronous generator of FIG. 1a.

DETAILED DESCRIPTION OF THE INVENTION

Figure 1A:
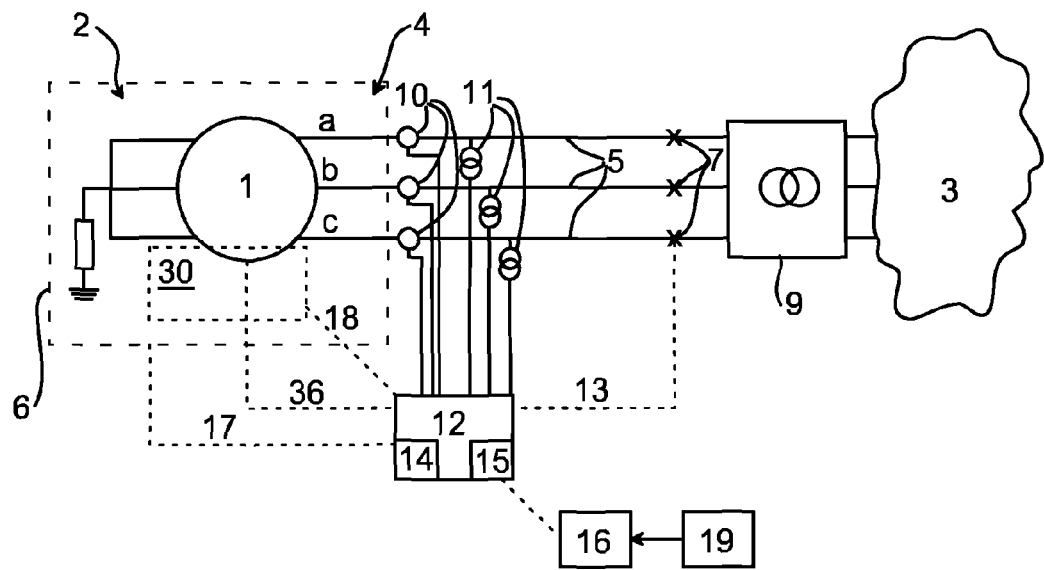
FIG. 1a shows a system for monitoring and protecting a synchronous generator according to the invention.

FIG. 1a illustrates an arrangement for protecting a synchronous generator 1. The synchronous generator 1 is connected to a power grid 3, such as a main national power grid 3, and arranged to generate and transfer electric power into the power grid 3. The synchronous generator 1 has a neutral side 2 wherein the windings of the synchronous generator 1 are interconnected in a Y-coupling and grounded via an impedance or a grounding transformer. The synchronous generator also comprises a terminal side 4 where each winding of the generator is connected to a respective conductor 5, one for each phase. The synchronous generator is connected to the power grid 3 by means of the conductors 5, such as bus bars or cables, and circuit breakers 7, arranged for connecting and disconnecting the synchronous generator 1 from the power grid 3. The synchronous generator is a three-phase synchronous generator 1 connected to a three-phase grid 3, and one conductor 5 and one circuit breaker 7 is arranged for each phase a, b, c. The connection between the synchronous generator 1 and the power grid 3 also includes a step-up transformer arrangement 9, so that the low voltage level power in generator side could be transformed into high voltage level power to the power grid 3 for possible long distance power transmission. The synchronous power generator 1 is mechanically coupled to a turbine system 6, for example a hydro power turbine, or steam turbine from a nuclear reactor or fossil fuel boiler.

The arrangement also comprises a monitoring and protection system 10-17 comprising current measuring devices 10 in the form of current transformers 10 and voltage measuring devices 11 in the form of voltage transformers 11, one for each phase 10a-c and 11a-c, respectively. Each measuring device 10-11 is connected by means of secondary cables to a protection unit 12 and arranged and adapted for transferring measurements of currents and voltages to the protection unit, the measuring devices are provided to transfer each phase current ($I_a$, $I_b$, $I_c$) and each phase voltage ($V_a$, $V_b$, $V_c$) to the protection unit 12. Further, the protection unit 12 is operatively connected by secondary cables 13 to the circuit breakers 7a-c and arranged to selectively transfer trip commands to each circuit breaker 7a-c and adapted to selectively connect or disconnect the synchronous generator 1 to and from the power grid 3. The protection unit 12 operatively connected by secondary cables (such as 17 and 36) to the other parts of the generating system, including turbine 6 and rotor exciter system 30 to selectively connect or disconnect the turbine 6 and the rotor exciter system 30. The protection unit 12 includes computer hardware, screen display 14, alarm system 15 and communication system which connect the protection unit 12 with a substation automation system 16 where the operators 19 get alarm signals upon detecting a failure. The detecting and protecting system is adapted to measure the phase currents and the phase voltages at the terminal side 4 of the synchronous generator 1. The detecting and protecting system is adapted to analyse the measurements and take action if a fault is detected, such as alerting an operator visually on the screen, audibly via the loudspeaker, trip the generator 1 from the power grid 3, disconnect the turbine and disconnect the rotor excitation system of the synchronous generator.

The invention is directed to detect and protect against winding faults of the synchronous generator, but may also advantageously include other types of detection and protection arrangements, however not described herein. The detecting and protection system 10-17 is therefore, in accordance with the invention, adapted to analyse the measured currents and voltages to discover winding faults, especially inter-turn faults, and also to protect against such faults by taking action upon detecting such a fault. The detecting and protecting system 10-17 may suitably be incorporated in an already existing power generator protection system of a synchronous generator by implementing the winding fault diagnosing method and protecting methods of the invention. Such an implementation may be performed by a computer program added to an existing protection system, for example when hardware like the current 10 and voltage 11 measuring devices, a protection unit 12 and an output, such as a monitor 14, is already included in the system.

Figure 1B:
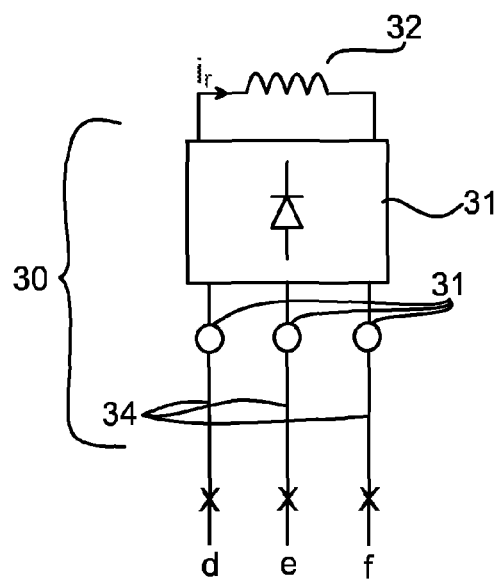
FIG. 1b shows parts of the system, used for additional monitoring measurement of rotor currents.
Figure 5:
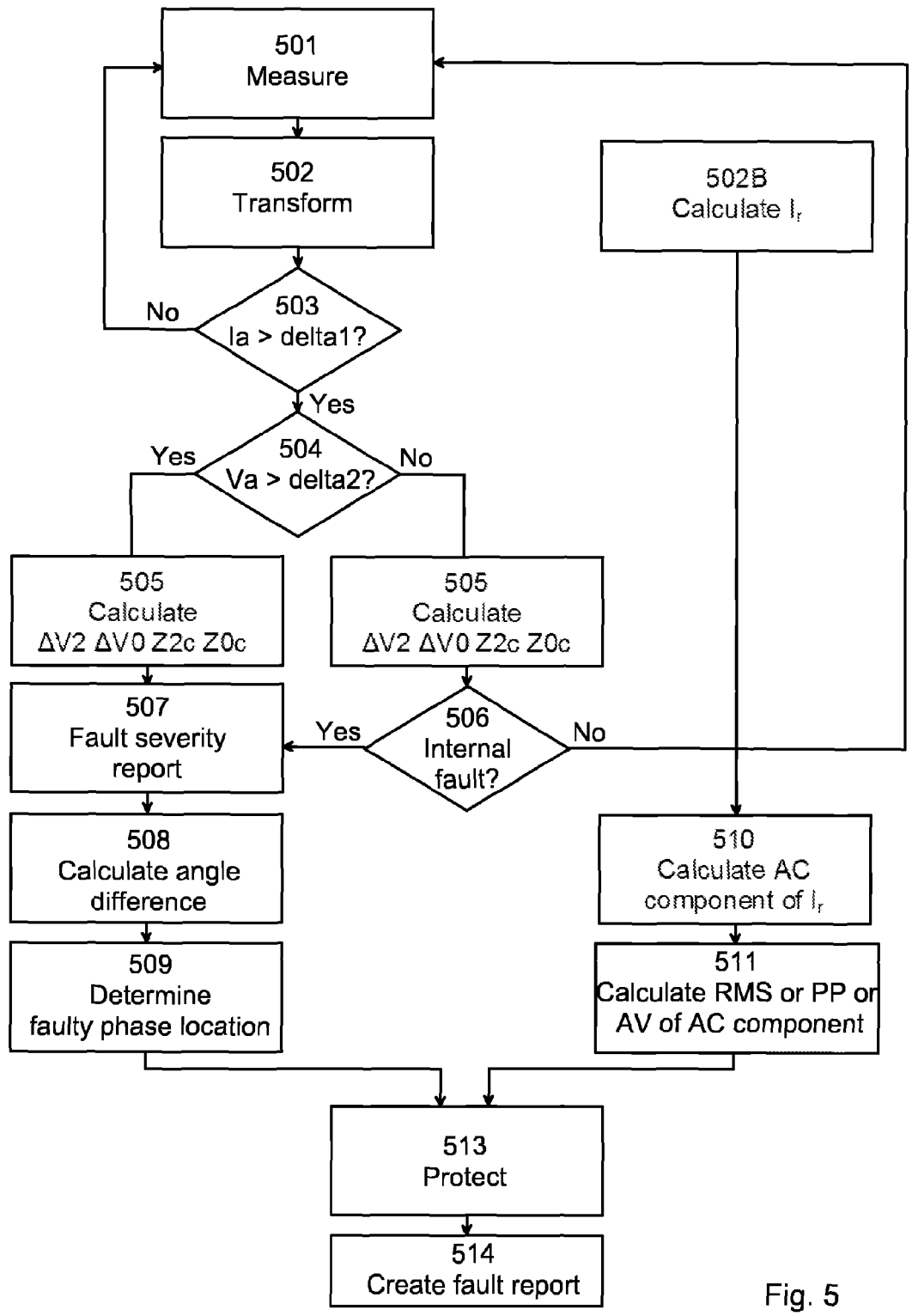
FIG. 5 illustrates a further method for protecting a synchronous generator in accordance with the invention.

The protection unit 12 is also connected to the rotor exciter circuit 30 of the rotor (signal connection 18), and the rotor field winding (32) of the synchronous generator 1. The exciter circuit (30) is for reasons of clarity illustrated with "broken lines", but is illustrated further in FIG. 1b. The protection unit 12 is adapted to measure AC phase currents of the exciter phase d, e, f terminals 34 and includes means for detecting inter-turn faults from these measurements. This additional detection will be described further below referring to FIG. 1b and FIG. 5 illustrating method steps including rotor field winding current analysis.

Figure 2:
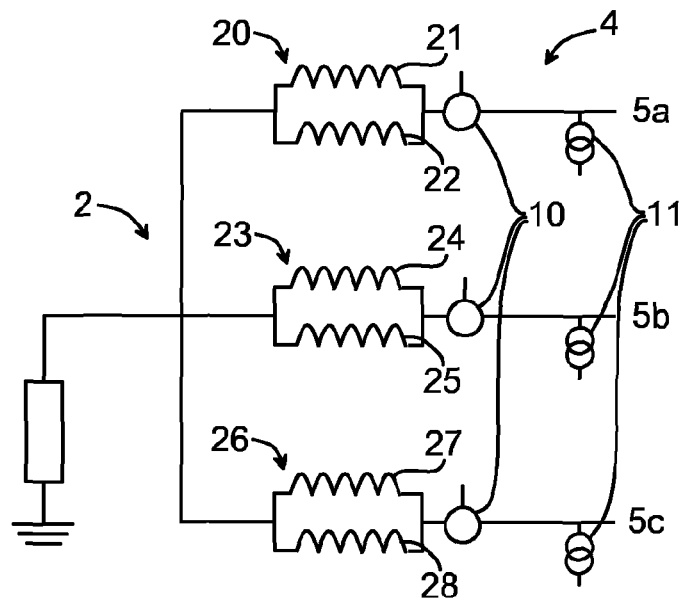

FIG. 2 illustrates the windings 20, 23, 26 of the synchronous generator in more detail and the positions of the current 10 and voltage 11 measuring devices. The synchronous generator 1 includes two winding branches per phase, that is, 21, 22, 24, 25, 27, 28 and one single current measuring device 10a, b, c and one single voltage measuring device 11a, b, c is arranged per phase. Thus, current measuring devices 10a-c measure the three phase currents, $I_a$, $I_b$, or $I_c$ from all windings, in this case both branches, for each phase winding.

The invention can be applied to synchronous generators having only one branch per phase. The invention can be applied to synchronous generators having three or four or more branches per phase. The calculations are, however, only based on terminal currents and voltages, e.g. three phase currents and voltages. No current transformers that measure the current through each branch winding (or split phase) are needed to be arranged on each winding branch.

Figure 3:
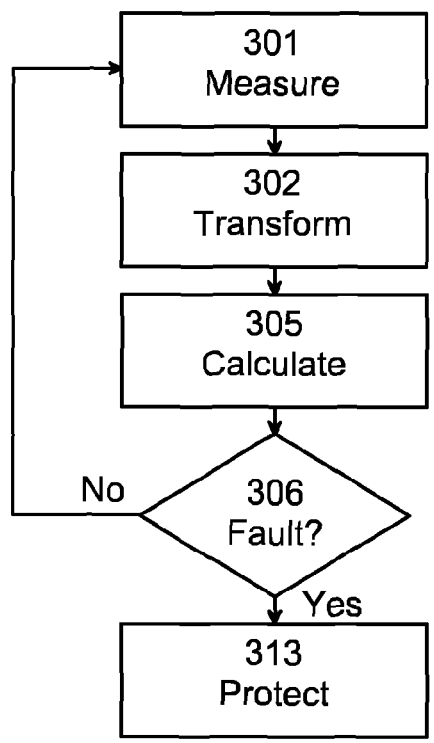
FIG. 3 illustrates a method for monitoring and protecting a synchronous generator in accordance with the invention.

FIG. 3 illustrates a monitoring and protecting method for a synchronous generator in accordance with the invention. The method starts with measuring (step 301) each phase current $I_a$, $I_b$, $I_c$ and each phase voltage $V_a$, $V_b$, $V_c$ at the terminal side 4 of the synchronous generator 1. The measured currents ($I_a$, $I_b$, $I_c$) and voltages ($V_a$, $V_b$, $V_c$) are transformed, in step 302, into their, so called, symmetrical sequence components ($I_1$, $I_2$, $I_0$; $V_1$, $V_2$, $V_0$), also referred to as fundamental components. In a non-faulty state, the synchronous generator is influencing the power grid symmetrically and positive sequence components ($I_1$; $V_1$) are non-zero, whereas the zero sequence components ($I_0$; $V_0$) and the negative sequence components ($I_2$; $V_2$) are zero. In the following calculating step 305, the negative sequence residual voltage, the zero sequence residual voltage, the negative sequence coupling impedance and/or the zero sequence coupling impedance are/is determined. In the diagnosing step 306, the determined residual (or residuals) and/or coupling impedance (or impedances) is/are monitored and if any or the residual voltage(s) or coupling impedance(s) deviates a significant amount from zero; i.e. the non-faulty state, a winding fault is discovered. If a fault is discovered, the method continues to step 313 and protects the power arrangement, i.e. protects the generator 1 and the power grid 3. If no fault is discovered, the method returns to the first step, measuring step 301, and measures all the phase currents and voltages, and subsequently performs the following steps 302, 305, and 306 again.

FIG. 1b illustrates parts of the rotor exciter circuit 30 of FIG. 1a in more detail. The rotor exciter circuit is connected to the rotor field winding and adapted to provide a DC current $I_r$ to the field winding. For this purpose, terminals 34 of the rotor exciter circuit 30 are arranged to provide terminal phase currents d, e, f to the rectifier 31 of the exciter circuit 30. The rectifier 31 is provided to rectify the AC terminal phase currents $I_d$, $I_e$, $I_f$ into the DC rotor current $I_r$.

Figure 4:
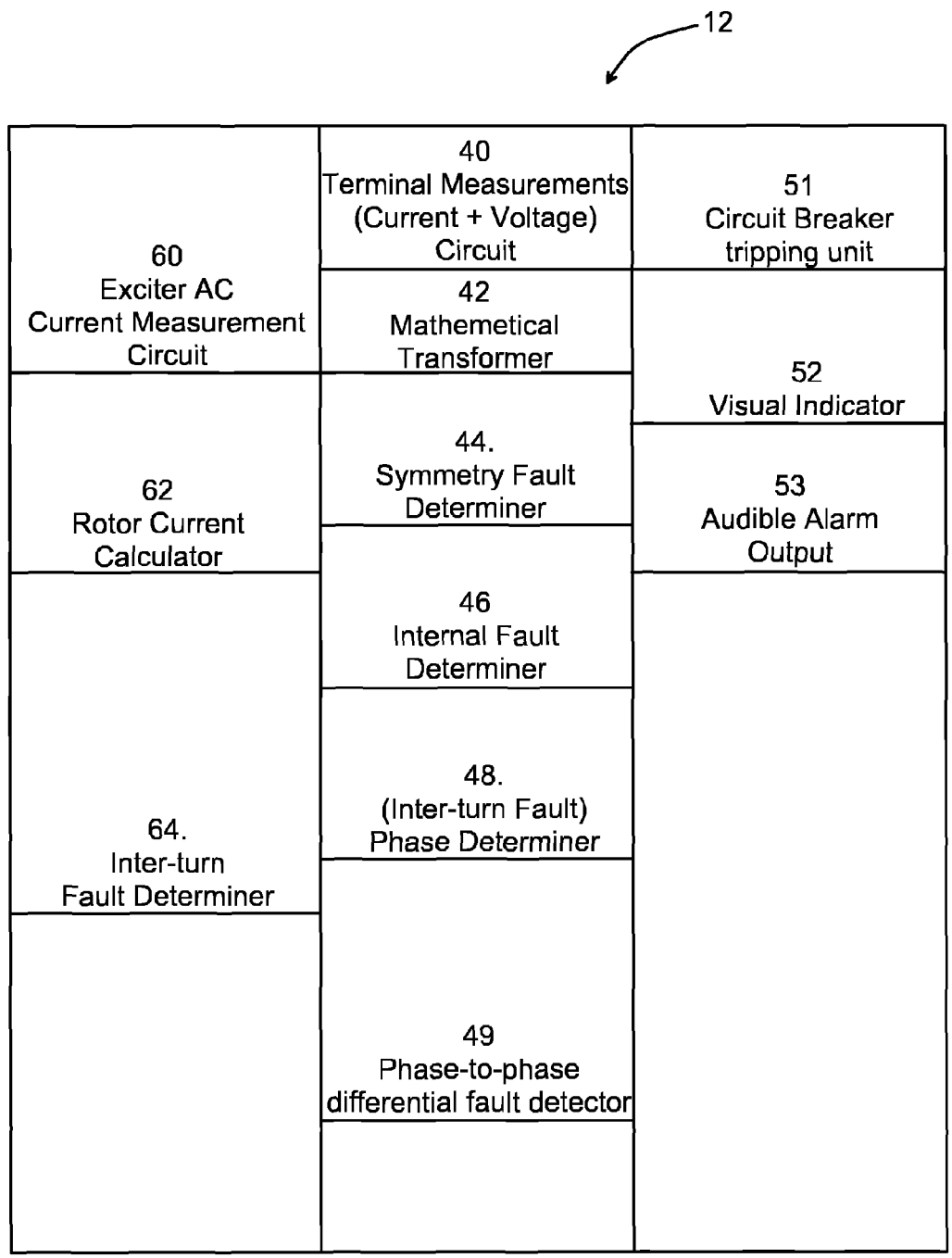
FIG. 4 illustrates a controller for monitoring and protecting a synchronous generator according to the invention.

FIG. 4 illustrates the protection unit 12 in more detail, which protection unit may be implemented in a computer hardware known as intelligent electronic devices (IEDs). The protection unit 12 comprises an analogue input measurement circuit (including A/D converters) 40 connected to voltage 11 and current 10 measuring devices, which analogue input measurement circuit 40, including A/D converters arranged for digitalizing the measuring signals, is arranged and adapted to receive the terminal phase voltages ($V_a$, $V_b$, $V_c$) and currents ($I_a$, $I_b$, $I_c$), i.e. the measurement signals of each phase voltage and phase current. The protection unit 12 further includes means for evaluating the digitalized measurements of phase currents ($I_a$, $I_b$, $I_c$) and voltages ($V_a$, $V_b$, $V_c$). The protection unit 12 includes a mathematical transformation provider 42 for handling the measurements mathematically and which is adapted for transforming the phase currents ($I_a$, $I_b$, $I_c$) and voltages ($V_a$, $V_b$, $V_c$) into their symmetrical sequence, or fundamental, components ($I_1$, $I_2$, $I_0$; $V_1$, $V_2$, $V_0$); comprising the positive sequence voltages and currents ($V_1$, $I_1$), the negative sequence voltages and currents ($V_2$, $I_2$), and the zero sequence voltages and currents ($V_0$, $I_0$). The symmetrical sequence components are subsequently used by the protection unit 12 for detecting whether the synchronous generator 1 suffers from an internal winding fault.

The protection unit 12 further includes a symmetry fault determiner 44 for determining if the negative sequence components ($V_2$, $I_2$) indicate the presence of a symmetry fault. Such symmetry fault may originate from an internal winding fault of the synchronous generator 1 and/or from an unbalance fault of the external power grid 3. To determine if the synchronous generator 1 suffers from an internal fault, the symmetry fault determiner 44 is adapted to monitor the amounts of the negative sequence voltages ($V_2$) and currents ($I_2$), respectively. The symmetry fault determiner 44 is adapted to compare the large negative sequence current ($I_2$) and the negative sequence voltage ($V_2$) with thresholds to determine the presence of an internal winding fault in the synchronous generator 1. If both the negative sequence current and the negative sequence voltage are below their respective threshold, the symmetry fault determiner 44 is adapted to determine that the synchronous generator is healthy. A comparatively large negative sequence current ($I_2$) in combination with a small, or close to zero, negative sequence voltage ($V_2$) indicates that the synchronous generator suffers from an internal fault. For detecting such an internal fault, the symmetry fault determiner 44 is adapted to investigate if the negative sequence voltage ($V_2$) is below a first threshold (delta1 of for example 0.5-2% of the total voltage $V_1$), and if the negative sequence current ($I_2$) is above a second threshold (delta2, of for example 2-5% of the total current $I_1$).

A relatively large negative sequence voltage ($V_2$) in combination with a relative large negative sequence current ($I_2$) indicates an unsymmetrical fault; which unsymmetrical fault may be internal or external. To determine the presence of such an unsymmetrical fault, which may indicate a faulty synchronous generator but also an unbalanced power grid, the symmetry fault determiner 44 is adapted to compare the negative sequence voltage $V_2$ and determine if the voltage is above a third threshold (delta3), which threshold preferably are of the same magnitude as the first voltage threshold (delta1), and which third voltage threshold is approximately the same as the first threshold for example 1% (of the positive sequence voltage). Moreover, the symmetry fault determiner 44 is adapted to compare if the negative sequence current ($I_2$) is above a fourth threshold (delta4), which threshold preferably is of the same magnitude as the second threshold, for example 2-5% of the positive sequence current. If the symmetry fault determiner 44 determines that both the negative sequence voltage $V_2$ is above the third threshold and that the negative sequence current ($I_2$) is above the fourth threshold, it is adapted to determine the presence of an unsymmetrical fault, and the protection unit 12 is adapted to further investigate if the unsymmetrical fault is an internal winding fault of the generator 1, or external symmetry fault of the power grid 3.

For the purpose of determining if the synchronous generator 1 suffers from an internal fault, the protection unit 12 comprises an internal fault determiner 46 for detecting internal winding faults of the synchronous generator 1. The internal fault determiner 46 is adapted to use the symmetric sequence components ($I_1$, $I_2$, $I_0$; $V_1$, $V_2$, $V_0$) of the terminal phase currents ($I_a$, $I_b$, $I_c$) and voltages ($V_a$, $V_b$, $V_c$) together with impedance characteristics of the synchronous generator 1 to determine if the synchronous generator suffers from a winding fault. As was partly described with reference to FIG. 3 and will be described in greater mathematical detail below in "analysis 1", the internal fault determiner 46 calculates at least one of four indicators of internal winding faults, preferably the internal fault determiner 46 calculates more than one, preferably two indicators. The internal fault determiner 46 is adapted to calculate the coupling impedances (the negative sequence coupling impedance $Z_{2C}$ and the zero sequence coupling impedances $Z_{0C}$), and the residual voltages. Thus, alternatively, or additionally, the internal fault determiner 46 is adapted to calculate one or both of a negative sequence ($\Delta V_2$) residual voltage and a zero sequence residual ($\Delta V_0$) voltage.

Figure 6:
FIG. 6 illustrates the direction of negative sequence currents during a fault.
Figure 6:
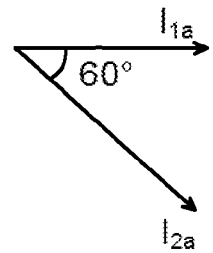
Figure 6:
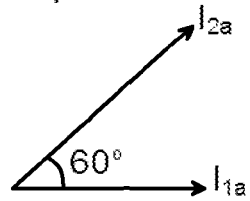

Moreover, the protection unit 12 is provided with an inter-turn fault and phase determiner 48, which is provided for determining the presence of an inter-turn fault and which phase of the synchronous generator that suffers from the inter-turn fault. The inter-turn fault and phase determiner 48 is adapted to determine the angle (alpha) between the negative sequence current ($I_2$) and the corresponding positive sequence current ($I_1$). This angle (alpha) indicates in which phase winding 20, 23, 27 of the synchronous generator 1 the inter-turn fault is located. These calculations are further described in "analysis 2" below and are illustrated in FIG. 6.

Power generating systems are normally provided with phase-to-phase differential fault protection functions. It is preferred the invention is installed in a power generating system already provided with a phase-to-phase fault protection, but the protection unit 12 may include such a feature by comprising a phase-to-phase fault detector 49 provided to determine phase-to-phase faults and/or phase-to-ground faults from the terminal phase currents. Such phase-to-phase fault detection is not the main subject of the invention and therefore not described further herein. A phase-to-phase fault also affects the symmetry of the generator and therefore such a fault need to be handled or taken into consideration when employing the invention.

The protection unit 12 is also provided with means 51-53 for protecting the synchronous generator 1 and the power system 3 upon detecting a fault. For this purpose the protection unit 12 comprises a circuit breaker tripping unit 51, which is operatively connected to the circuit breakers 7 that connect the synchronous generator 1 to the power grid 3. The protection unit also comprises a visual indicator 52 operatively connected to a display 14 and adapted to output a visual indication for an operator indicating a fault, preferably indicating type of fault, such as a winding fault, for example, and preferably indicating an inter-turn fault and in which phase winding of the synchronous generator the inter-turn fault is located. The protection unit 12 is adapted to provide such a visual indication upon detecting the corresponding fault to the operator 19 through substation automation system 16. The protection unit 12 further comprises an audible alarm output 53 connected to a loudspeaker 15 for the operator 19 of the substation automation system 16 for alarming when a fault is determined. The protection unit may suitably be part of substation automation system 16 which is provided for controlling the overall power generating apparatus including a turbine, a generator 1, a transformer 9 substation and connections to a power grid 3.

The protection unit 12 also provides additional means for determining inter-turn faults, which monitors the rotor current of the synchronous generator. For this purpose, the protection unit 12 comprises a measurement circuit (60 in FIG. 4) arranged and adapted for receiving AC current measurements of the rotor exciter terminal 34 phase currents $I_d$, $I_e$, $I_f$. The protection unit 12 also includes a calculator 62 adapted to calculate the rotor field winding current ($I_r$) from the exciter phase terminal currents ($I_d$, $I_e$, $I_f$).

The protection unit further comprises an additional inter-turn fault detector adapted to diagnose inter-turn faults from the calculated rotor field winding current ($I_r$). The calculations are described below in section "analysis 3".

FIG. 5 illustrates further embodiments of a method for detecting and protecting against internal winding faults, especially inter-turn faults, of a synchronous generator in accordance with the invention. The method starts with measuring (step 501) the terminal phase voltages ($V_a$, $V_b$, $V_c$) and currents ($I_a$, $I_b$, $I_c$) of the stator. The measuring also includes measuring the phase currents ($I_d$, $I_e$, $I_f$) on the AC side terminals 34 of the rotor excitation circuit 30.

The following step 502 includes transforming the measured values, of the terminal phase voltages ($V_a$, $V_b$, $V_c$) and currents ($I_a$, $I_b$, $I_c$) of the stator, into the symmetrical sequence components ($V_1$, $V_2$, $V_0$) and currents ($I_1$, $I_2$, $I_0$). These symmetrical sequence components are used in the further analysis. In parallel to the transforming step 502 of the stator measurements, the method includes a step 502B of calculating the rotor field winding current $I_r$ from the phase currents ($I_d$, $I_e$, $I_f$) of the exciter circuit 30, for example summarizing the absolute values of the phase currents ($I_d$, $I_e$, $I_f$).

The parallel analyzing branch of analyzing the rotor current $I_r$ continues with calculating, step 510, the AC components of the rotor current $I_r$. The DC component of the rotor current $I_r$ and the $6^{th}$ harmonics (the $n*6^{th}$ harmonics including the $6^{th}$ harmonic and higher order, i.e. 12th, $18^{th}$ ... harmonics) are subtracted from the rotor current $I_r$. The parallel branch of analyzing the rotor current $I_r$ continues with the step 511 of determining if there are other AC components in the rotor current $I_r$ apart from the filtered $6^{th}$ harmonics. This is determined by calculating the RMS value of the remaining current $I_{remain}$ (after removing DC and $6^{th}$ harmonics), or calculating the peak to peak variations of the remaining current $I_{remain}$ or calculating the average value of the remaining current $I_{remain}$ values. The result of the calculation 511 is used for creating a fault report in step 514, which fault report also is based on the analysis of the stator. If the calculated AC content (RMS, or peak to peak, or average) of the remaining current $I_{remain}$ is larger than a threshold, the rotor current analysis is used to confirm in report step 514 that the synchronous generator suffers from an inter-turn fault.

After transforming step 502, the stator analysis continues with establishing, step 503, whether the negative sequence current $I_2$ is larger than a second threshold (delta 2). If the negative sequence current $I_2$ is close to zero, i.e. smaller than the threshold delta 2, it is deduced that the synchronous generator is not suffering from an internal fault and the process returns to the first step of measuring 501 the terminal currents and voltages. If, however, it is discovered that there is a negative sequence current $I_2$, being larger than the threshold delta 2, which indicates a fault, the method continues with establishing, step 504, whether the negative sequence voltage is smaller than a first threshold (delta 1). If the voltage is small, i.e. smaller than the first threshold, it is deduced that the synchronous generator suffers from an internal fault. If however, the negative sequence voltage is larger than the threshold it cannot be deduced that the synchronous generator 1 suffers from an internal fault, the fault may be from the external power grid 3.

Having established an internal fault in step 504, based on the negative sequence voltage being smaller than the first threshold delta 1, for example the first threshold being approximately 2-5% of the positive sequence voltage. The process continues with calculating 505a at least one of four variables. If it cannot be concluded that the generator suffers from an internal fault in step 504, because the negative sequence voltage is larger than the first threshold delta 1, the process continues with calculating 505b at least one of four variables. Step 505a and 505b includes the same calculating step 505. The result from 505a is used for determining the severity of the internal fault in step 507, and the result of 505b is used to determine in step 506 whether the fault is internal or external, and if it is internal, the result is also used in step 507 to determine the severity of the fault. The calculating of at least one of four variables in step 505, consists of calculating a residual voltage ($\Delta V_2$ or $\Delta V_0$) and/or coupling impedance ($Z_{2C}$ or $Z_{0C}$).

In more detail, the first variable is a negative sequence residual voltage $\Delta V_2$, which is calculated using the negative sequence voltage $V_2$, the negative sequence current $I_2$ and a negative sequence self impedance $Z_{22}$ of the synchronous generator 1. The calculating will be described more in "Analysis 1" detailed below leading to an "equation 5" for calculating this negative sequence residual voltage $\Delta V_2$.

Similarly, equations (5)-(8) describe how the other three variables may be calculated. Thus, step 505 includes calculating at least one of the four variables in accordance with the corresponding equations (5)-(8), detailed in section "Analysis 1". The second variable is the zero sequence residual voltage $\Delta V_0$, which is calculated from the zero sequence voltage $V_0$, the zero sequence current $I_0$ and the zero sequence self impedance $Z_{0C}$ of the synchronous generator 1.

The third variable is the negative sequence coupling impedance $Z_{2C}$, which is calculated from the negative sequence voltage $V_2$, the negative sequence current $I_2$, the negative sequence self impedance $Z_{22}$ and the positive sequence current $I_1$.

The fourth variable is the zero sequence coupling impedance $Z_{0C}$, which is calculated from the zero sequence voltage $V_0$, the zero sequence current $I_0$, the zero sequence self impedance $Z_{00}$ and the positive sequence current $I_1$.

If the calculated variable, or variables, are larger than a threshold it is concluded that the generator suffers from an internal fault diagnosing step 506, and the magnitude of the calculated variable is used in the subsequent step 507 to determine the severity of the fault, since the magnitude of each one of the variables is indicative of the severity of the internal fault. Also, if the variable is below the threshold, it is concluded that there is not internal fault in the synchronous generator and the process returns to the first step 501 of measuring the terminal voltages and currents of the stator, and preferably also the rotor exciter circuit AC terminal currents.

Step 507 includes creating a fault severity report of the internal fault, which internal fault severity is determined from the magnitudes of the calculated variables. Step 507 is followed by step 508 in FIG. 5, but step 507 may alternatively be included in step 514 of creating a fault report. The result of step 507 is preferably used when creating the fault report in step 514.

Step 508 comprises calculating the angle difference between the negative sequence currents $I_2$ and the positive sequence currents $I_1$, at least one angle difference is calculated between one negative sequence current and the corresponding positive sequence current of that phase. These angles may be calculated already in step 502 when the measured terminal currents (Ia, Ib, Ic) have been transformed into symmetrical sequence components (I1, I2, I0), in which case calculating step 508 is incorporated into the transforming step 502. The calculated angles can be used to determine that the internal fault is an inter-turn fault, which is further described in section "analysis 2" and illustrated in FIG. 6. The calculated angle discovers an inter-turn fault if the angle is one of three angles, or close to one of three angles. These three angles are 180 degrees, minus 60 degrees and 60 degrees. Moreover, the angle indicates in which phase the synchronous generator suffers from an inter-turn fault. The step of calculating the angle difference is followed by a step of determining in which phase (step 509), the synchronous generator suffers from an inter-turn fault.

The method continues with the subsequent step of creating a fault report 514, which preferably includes the fault severity report that was created in step 507, the result of the rotor current analysis from step 511 that includes an indication of the amount of fault indicating AC components, for example RMS value of these components, in the rotor DC current (the fault indicating AC components being Ac components without the 6$^{th}$ harmonics), and including indicating an internal fault and whether the internal fault is an inter-turn fault, and in which phase that inter-turn fault can be found.

The method steps of monitoring the synchronous generator, step 501-511, is followed by a protecting step 513, so that the monitoring also includes taking action when an internal fault is discovered. The protecting step 513 includes at least one of making a visual indication for an operator, making an audible alarm, stopping the power generating process by tripping the generator circuit breaker and disconnecting the generator from the power grid. Preferably, the protecting step 513 is followed by a fault report creating step 514. Also, the created fault report from step 514 is suitably transferred to operator work stations and control arrangements of the power generating process.

This invention introduces new methods to detect stator inter-turn faults of synchronous generators with improved sensitivity and reliability. The proposed method has the advantage of non-intrusiveness and requires no extra dedicated measurement transformers for the synchronous generator inter-turn fault detection, i.e. no extra compared to conventional power measuring devices. Instead the invention uses only the current and voltage measurements from the generator terminals 5, which measurements normally are available at power generators, and normally used for monitoring voltage, current and power supplied from a power generator 1. The invention proposes a combined utilization of two methods. The first method utilizes symmetrical component analysis of the stator voltages and currents and the sequence impedance matrix of a synchronous generator 1. The second method is based on rotor field-winding 31 current time-domain analysis.

Analysis 1

The invention uses the sequence component impedance matrix method. The synchronous generator sequence component impedance matrix method for inter-turn fault detection is described as the following. The synchronous generator steady-state voltage equations in abc phase coordinates can be expressed as (equation 1):

$$\begin{pmatrix} Zaa & Zab & Zac \\ Zab & Zbb & Zbc \\ Zac & Zbc & Zcc \end{pmatrix} \begin{pmatrix} Ia \\ Ib \\ Ic \end{pmatrix} = \begin{pmatrix} Ea \\ Eb \\ Ec \end{pmatrix} - \begin{pmatrix} Va \\ Vb \\ Vc \end{pmatrix} \quad (1)$$

where $V_{abc}$ are the terminal voltages of the synchronous generator, and $I_{abc}$ are the terminal currents of the synchronous generator. $E_{abc}$ are the synchronous generator internal emf voltages. (In the matrix equation $Z_{aa}$ has for clarity been written without using subscripts as Zaa).

Equation (1) can be transformed into the sequence coordinates as the following (equation 2):

$$\begin{pmatrix} Z11 & Z12 & Z10 \\ Z21 & Z22 & Z20 \\ Z01 & Z02 & Z00 \end{pmatrix} \begin{pmatrix} I1 \\ I2 \\ I0 \end{pmatrix} = \begin{pmatrix} E1 \\ E2 \\ E0 \end{pmatrix} - \begin{pmatrix} V1 \\ V2 \\ V0 \end{pmatrix} \quad (2)$$

where $(V_1\ V_2\ V_0)^{-1} = T(V_a\ V_b\ V_c)^{-1}$, $(I_1\ I_2\ I_0)^{-1} = T(I_a\ I_b\ I_c)^{-1}$, and $(E_1\ E_2\ E_0)^{-1} = T(E_a\ E_b\ E_c)^{-1}$.

Here T is the transformation matrix, for transforming the phase voltages and phase currents into their symmetrical, or fundamental, components $$T = \frac{1}{3}\begin{pmatrix} 1 & a & a^2 \\ 1 & a^2 & a \\ 1 & 1 & 1 \end{pmatrix}$$

wherein a is a complex unit of 120 degrees, so that $$a = e^{\frac{j2\pi}{3}}.$$

In healthy conditions, if the synchronous generator is well balanced, equation (2) can be diagonalized as (equation 3):

$$\begin{pmatrix} Z11 & & \\ & Z22 & \\ & & Z00 \end{pmatrix} \begin{pmatrix} I1 \\ I2 \\ I0 \end{pmatrix} = \begin{pmatrix} E1 \\ 0 \\ 0 \end{pmatrix} - \begin{pmatrix} V1 \\ V2 \\ V0 \end{pmatrix} \quad (3)$$

If there is slight unbalance due to synchronous generator construction, the off-diagonal elements in equation (2) may exist but with very small values. Under inter-turn fault condition, the synchronous generator impedance matrix and the back emfs (electromotive forces E1, E2, E0) are not symmetrical and thus results in the following voltage equations (equation 4):

$$\begin{pmatrix} fZ11 & fZ12 & fZ10 \\ fZ21 & fZ22 & fZ20 \\ fZ01 & fZ02 & fZ00 \end{pmatrix} \begin{pmatrix} I1 \\ I2 \\ I0 \end{pmatrix} = \begin{pmatrix} E1 \\ E2 \\ E0 \end{pmatrix} - \begin{pmatrix} V1 \\ V2 \\ V0 \end{pmatrix} \quad (4)$$

where $fZ_{120}$ are $Z_{120}$ under a faulty condition. (Using superscript for f (for fault) and subscripts for the element numbers notation, we write $Z^f_{11}$ in the following text.).

Comparing equation 3 and equation 4, the changes of the off-diagonal elements in the synchronous generator sequence impedance matrices can be used as a fault indicator for inter-turn faults of the synchronous generator.

Manipulating equation (4), we define the so-called negative sequence residual voltage (5) and zero sequence residual voltage (6), respectively, as it can be shown that $$\Delta V_2 = Z^f_{21}I_1 + Z^f_{20}I_0 - E_2 = -V_2 - Z^f_{22}I_2 \quad (5)$$

$$\Delta V_0 = Z^f_{01}I_1 + Z^f_{02}I_2 - E_0 = -V_0 - Z^f_{00}I_0 \quad (6)$$

We also define the negative sequence coupling impedance $Z_{2C}$ and the zero sequence coupling impedance $Z_{0C}$ (where "c" refer to coupling) as $$Z_{2C}=\Delta V_2/I_1=Z'_{21}+Z'_{20}(I_0/I_1)-(E_2/I_1) \quad (7)$$

$$Z_{0C}=\Delta V_0/I_1=Z'_{01}+Z'_{02}(I_2/I_1)-(E_0/I_1) \quad (8)$$

and wherein the coupling impedances are the coupling to the positive sequence, i.e. $Z_{2C}$ is the negative sequence coupling impedance to the positive sequence, and $Z_{0C}$ is the zero sequence coupling impedance to the positive sequence.

For healthy synchronous generators, the negative sequence $\Delta V_2$ residual voltage and zero sequence $\Delta V_0$ residual voltage are close to zero. The negative sequence coupling impedance $Z_{2C}$ and the zero sequence coupling impedances $Z_{0C}$ are also close to zero.

During inter-turn fault condition, the internal symmetry of the synchronous generator is destroyed. The negative and zero sequence residual voltages ($\Delta V_2$; $\Delta V_0$, respectively) and negative and zero sequence coupling impedances ($Z_{2C}$; $Z_{0C}$, respectively) (5)-(8) are not zero. Instead the negative and zero sequence residual voltages ($\Delta V_2$; $\Delta V_0$) and negative and zero sequence coupling impedances ($Z_{2C}$; $Z_{0C}$) are dependent on the severity of the inter-turn fault.

Therefore, the invention proposes the use of any equation of equations (5)-(8) for detecting inter-turn faults of a synchronous generator. The right hand sides of equations (5)-(8) can be monitored to detect synchronous generator inter-turn faults. The terminal voltages $V_a$, $V_b$, $V_c$ and currents $I_a$, $I_b$, $I_c$ of the generator are measured and transformed into the symmetrical sequence, or fundamental, voltages $V_1$, $V_2$, $V_0$ and currents $I_1$, $I_2$, $I_0$, respectively.

The same method can also be used to calibrate the detecting variables (5)-(8); the negative and zero sequence coupling impedances, and the negative and zero sequence residual voltages, for a healthy synchronous generator. Thus an operating threshold value can be set above which the synchronous generator internal fault is detected. In order to avoid possible mistreatment due to external faults of synchronous generators, certain blocking criteria such as over-current blocking or under-voltage blocking criteria could be applied.

The fact that a network unbalance does not influence the correct detection of synchronous generator inter-turn fault detection which is an advantage compared with the harmonic signature based detection methods.

Analysis 2

The relative direction/angle between the negative sequence current $I_2$ of each phase (A, B, C), for example phase "a", and the positive sequence current $I_1$, of the same phase (a) indicate in which phase the inter-turn fault happens. Defining $I_{2a}$ as the negative sequence current of phase A and $I_{1a}$ as the positive sequence current of phase A, an angle of approximately 180° between $I_{2a}$ and $I_{1a}$ indicates an inter-turn fault in phase A. If inter-turn fault happens in phase B, the angle between $I_{2a}$ and $I_{1a}$ are around minus 60°. If inter-turn fault happens in phase C, the angle between $I_{2a}$ and $I_{1a}$ are around plus 60°. The invention is adapted to calculate the direction angle and on the bases of this angle deduce in which phase the synchronous generator suffers from an inter-turn fault. The invention is also adapted to use the calculated angle as an indication of an inter-turn fault in the synchronous generator.

FIG. 6 shows the directional relationships between the positive sequence current and the negative sequence current during an inter-turn fault, and exemplifies faults in the three different phases A, B, C. The figure use $I_{2a}$ as the negative sequence component of the current of phase A. The $I_{1a}$ is the positive sequence component of the current of phase A. As shown, the directional angle between the negative and the positive sequence component of the current of phase A is 180 degrees during an inter-turn fault in phase A. The directional angle between the negative and the positive sequence component of the current of phase A is "minus" 60 degrees during an inter-turn fault in phase B. The directional angle between the negative and the positive sequence component of the current of phase A is 60 degrees during an inter-turn fault in phase C.

Analysis 3

In addition to stator sequence component analysis, the rotor field-winding current time-domain analysis can also be used to detect the synchronous generator inter-turn fault as a final fault confirmation signature. Under healthy condition, synchronous generator rotor winding current is mainly DC and 6*n (n=1, 2, 3, . . . ) order harmonics resulted from the exciter rectifier circuits. The system is arranged to measure the exciter AC currents for each of the three phases (d, e, f). The rotor field winding current ($I_r$) is calculated from the measured exciter phase currents ($I_d$, $I_e$, $I_f$). The system is adapted to filter out the DC component and the 6n order harmonics. The system is adapted to discover other AC components by evaluating the AC components in the time-domain using root-mean-square (RMS) or an average (AV) or a peak-to-peak (PP) value. However, the rotor field winding analysis will be affected by imbalances in the terminal 34 feeding grid, and relies upon other methods for confirming the inter-turn fault diagnosis, such as analysis 1 and 2.

What is claimed is:

1. A method for monitoring, including detecting, internal winding faults, especially inter-turn faults, of a synchronous generator, which synchronous generator comprises a winding for each phase of a power network, a terminal for each phase arranged on a terminal side of the synchronous generator, and connected to the respective winding, the terminals on the terminal side is connected to an electrical power network, and the synchronous generator is arranged to input power to the electrical power network by means of the terminals, the method comprising:
    measuring the voltage of each phase at the at least one each terminal and the current of each phase at the terminal,
    determining whether the synchronous generator suffers from an internal fault especially inter-turn faults in any of its phases, wherein the determining includes;
    transforming the phase currents and the phase voltages into symmetric sequence currents and symmetric sequence voltages, respectively;
    monitoring at least one of the following variables:
        a negative sequence residual voltage;
        a zero sequence residual voltage;
        a negative sequence coupling impedance;
        a zero sequence coupling impedance; wherein each of the variables is calculated from symmetric sequence components and at least one generator specific impedance, and
    determining whether the synchronous generator suffers from a winding fault, or not, from the calculated at least one residual voltage or coupling impedance;
    the method further comprising an additional internal fault detection step including analysing the rotor field winding current of the synchronous generator.

2. The method according to claim 1, wherein
    the negative sequence residual voltage is monitored by means of the negative sequence voltage, the negative sequence current and the negative sequence self impedance;

the zero sequence residual voltage is monitored by means of the zero sequence voltage, the zero sequence current and the zero sequence self impedance;

the negative sequence coupling impedance is monitored by means of the negative sequence voltage, the negative sequence current, the positive sequence current and the negative sequence self impedance;

and/or the zero sequence coupling impedance is monitored by means of the zero sequence voltage, the zero sequence current, the positive sequence current and the zero sequence self impedance.

3. The method according to claim 1, comprising determining the direction angle of the negative sequence current in relation to the angle of the positive sequence current obtained from three-phase current components, and deducing that the internal fault is an inter-turn fault upon determining this angle to be approximately 180 degrees, 60 degrees or minus 60 degrees.

4. The method according to claim 3, comprising identifying which phase suffers from an inter-turn fault from the angle, wherein 180 degrees indicates the same phase as measured, minus 60 degrees indicates the subsequent phase, and 60 degrees indicates the previous phase.

5. The method according to claim 1, including protecting the synchronous generator upon determining that the synchronous generator suffers from an internal fault, which protecting includes at least one of the steps of:

displaying a visual indication of the inter-turn fault for an operator, alerting an operator by means of an audible alarm, disconnecting the synchronous generator from the power network.

6. The method according to claim 1, wherein the additional internal fault detection step is an inter-turn fault detection step including measuring the exciter circuit AC currents and calculating the field winding current of the rotor from the AC phase currents of the rotor exciter.

7. The method according to claim 6, wherein the inter-turn fault detection step includes detecting AC current components in the rotor field winding current after filtering $6^{th}$ harmonics currents from the calculated rotor current.

8. A system for detecting internal winding faults of a synchronous generator, which synchronous generator comprises a winding for each phase of a power network, at least one terminal for each phase arranged on a terminal side of the synchronous generator, and connected to the respective winding, the terminals on the terminal side is connected to an electrical power network, and the synchronous generator is arranged to input power to the electrical power network by means of the terminals, the detecting system comprises a measurement circuit arranged for receiving terminal phase voltages and terminal phase currents measurements;

a mathematical transformation provider for transforming each phase voltages into symmetrical sequence voltage components and each phase currents into symmetrical sequence current components; and a winding fault determiner adapted to detect internal winding faults in the synchronous generator from the negative sequence components, or the zero sequence components, of the voltages and currents;

the system further comprising an additional internal fault detector for analysing the rotor field winding current of the synchronous generator.

9. The system according to claim 8, wherein the winding fault determiner is adapted to detect an internal winding fault based on at least one of the following four variables;

a negative sequence residual voltage; a zero sequence residual voltage;

a negative sequence coupling impedance; and a zero sequence coupling impedance.

10. The system according to claim 9 wherein the negative sequence residual voltage is calculated from the negative sequence voltage, the negative sequence current and the negative sequence self impedance;

the zero sequence residual voltage is calculated from the zero sequence voltage, the zero sequence current and the zero sequence self impedance;

negative sequence coupling impedance is calculated from the negative sequence voltage, the negative sequence current, the positive sequence current and the negative sequence self impedance; and the zero sequence coupling impedance is calculated from the zero sequence voltage, the zero sequence current, the positive sequence current and the zero sequence self impedance.

11. The system according to claim 9, wherein each of the four variables is calculated from symmetric sequence components and at least one generator specific impedance.

12. The system according to claim 7, further including an inter-turn fault determiner adapted to discover an inter-turn fault by analysing the direction angle of at least one negative sequence current, in relation to the corresponding positive sequence current of the same phase.

13. The system according to claim 12, the inter-turn fault determiner includes a phase identifier adapted to identify which phase that suffers from an inter-turn fault by analysing the direction of the negative sequence current, wherein 180 degrees indicates the same phase as measured, 60 degrees indicates the subsequent phase, and minus 60 degrees indicates the previous phase.

14. The system according to claim 8 wherein the additional inter-turn fault detector is adapted for detecting an inter-turn fault and includes a rotor current calculator adapted to calculate the field winding current of the rotor from the AC phase currents of the rotor exciter.

15. The system according to claim 8 comprising symmetry fault detector adapted to monitor the amounts of the negative sequence voltages and the negative sequence currents, and to detect symmetry faults, including using at least one of the following criteria:

when the negative sequence currents exceeds a first small threshold at the same time as the negative sequence voltages is below a second small threshold determining that the synchronous generator suffers from an internal fault;

when the negative sequence currents exceeds a third small threshold at the same time as the negative sequence voltages is above a fourth small threshold diagnosing a symmetry fault, either that the synchronous generator suffers from an internal fault or that the network grid suffers from an imbalance.

16. A non-transitory computer readable medium storing a computer program product for determining an internal fault of a synchronous generator, which synchronous generator comprises a winding for each phase of a power network, a terminal for each phase being arranged on a terminal side of the synchronous generator, and connected to the respective winding, the terminals on the terminal side is connectable to an electrical power network, and the synchronous generator being arranged to input power to the electrical power network by means of the terminals, which computer program product when run on a computer that receives current and voltage measurements from measuring devices arranged at the phase terminals of a synchronous generator causes the computer to perform the following steps transforming the measured phase currents and the measured phase voltages into symmetric sequence currents and symmetric sequence voltages, respectively;

monitoring at least one of the following variables:
a negative sequence residual voltage;
a zero sequence residual voltage;
a negative sequence coupling impedance;
a zero sequence coupling impedance; wherein each of the variables is calculated from symmetric sequence components and at least one generator specific impedance, and determining whether the synchronous generator suffers from a winding fault, or not, from the calculated at least one residual voltage or coupling impedance;

the computer program product also causing the computer to perform an additional internal fault detection step including analysing the rotor field winding current of the synchronous generator.

17. The non-transitory computer readable medium according to claim 16, wherein the negative sequence residual voltage is monitored by means of the negative sequence voltage, the negative sequence current and the negative sequence self impedance;

the zero sequence residual voltage is monitored by means of the zero sequence voltage, the zero sequence current and the zero sequence self impedance;

the negative sequence coupling impedance is monitored by means of the negative sequence voltage, the negative sequence current, the positive sequence current and the negative sequence self impedance;

and/or the zero sequence coupling impedance is monitored by means of the zero sequence voltage, the zero sequence current, the positive sequence current and the zero sequence self impedance.

18. The non-transitory computer readable medium according to claim 16, comprising determining the direction angle of the negative sequence current in relation to the angle of the positive sequence current of at least one phase, and deducing that the internal fault is an inter-turn fault upon determining this angle to be approximately 180 degrees, 60 degrees or minus 60 degrees.

19. The non-transitory readable medium according to claim 18, comprising identifying which phase suffers from an inter-turn fault from the angle, wherein 180 degrees indicates the same phase as measured, minus 60 degrees indicates the subsequent phase, and 60 degrees indicates the previous phase.

20. The non-transitory readable medium according to claim 16, also causing the computer to perform at least one of the steps of:

displaying a visual indication of an inter-turn fault for an operator, providing an audible alarm signal for an operator, providing a tripping signal for disconnecting the synchronous generator from the power network, upon determining that the synchronous generator suffers from an internal fault.

* * * * *